United States Patent
Shen et al.

(10) Patent No.: US 9,978,419 B2
(45) Date of Patent: May 22, 2018

(54) DISK DRIVE THERMAL PERFORMANCE TESTING DEVICES AND METHODS THEREOF

(71) Applicant: NetApp, Inc., Sunnyvale, CA (US)

(72) Inventors: Jun Shen, Cupertino, CA (US); Mark Feldmeyer, San Jose, CA (US); David Kwong, Fremont, CA (US); Dan Ho, Fremont, CA (US)

(73) Assignee: NetApp, Inc., Sunnyvale, CA (US)

( * ) Notice: Subject to any disclaimer, the term of this patent is extended or adjusted under 35 U.S.C. 154(b) by 62 days.

(21) Appl. No.: 15/167,210

(22) Filed: May 27, 2016

(65) Prior Publication Data

US 2017/0345455 A1 Nov. 30, 2017

(51) Int. Cl.
| | |
|---|---|
| *G01R 1/00* | (2006.01) |
| *G11B 33/08* | (2006.01) |
| *G06F 1/16* | (2006.01) |
| *G11B 20/18* | (2006.01) |
| *G01R 31/00* | (2006.01) |

(52) U.S. Cl.
CPC ........ *G11B 20/1816* (2013.01); *G01R 31/003* (2013.01)

(58) Field of Classification Search
CPC ............ G01R 31/2874; G01R 31/2886; G01R 31/2891; G01R 31/2862; G01R 31/2831; G11B 33/121; G11B 33/128
See application file for complete search history.

(56) References Cited

U.S. PATENT DOCUMENTS

| | | | |
|---|---|---|---|
| 5,311,448 A | 5/1994 | Waggoner et al. | |
| 6,039,471 A | 3/2000 | Wyland | |
| 7,095,201 B1* | 8/2006 | Schreck | G11B 5/5521 318/400.09 |
| 7,184,925 B2 | 2/2007 | Augustin et al. | |
| 7,982,468 B2 | 7/2011 | Vacar et al. | |
| 2001/0019462 A1* | 9/2001 | Ogawa | G11B 33/121 360/69 |
| 2008/0030945 A1* | 2/2008 | Mojaver | G06F 1/181 361/679.33 |
| 2009/0265136 A1* | 10/2009 | Garcia | G11B 19/048 702/183 |
| 2009/0279246 A1* | 11/2009 | Nguyen | G06F 1/187 361/679.34 |
| 2012/0327595 A1* | 12/2012 | Caldwell | G11B 33/08 361/679.59 |

* cited by examiner

*Primary Examiner* — Minh N Tang
(74) *Attorney, Agent, or Firm* — LeClairRyan PLLC (57) ABSTRACT

A disk drive thermal performance testing device includes a drive housing, an electrical connector and an adjustable power loading device. The drive housing is at least partially made of a thermally conductive material. The electrical connector is in the drive housing and provides an external connection. The adjustable power loading device is located in the drive housing, is coupled to the electrical connector, and is thermally coupled to the drive housing.

10 Claims, 8 Drawing Sheets

DISK DRIVE THERMAL PERFORMANCE TESTING DEVICES AND METHODS THEREOF

FIELD

This technology generally relates to methods and devices for thermal validation testing and, more particularly, to disk drive thermal performance testing devices and methods thereof.

BACKGROUND

During the development of the next generation of storage systems, it is important to validate whether these storage systems have enough cooling capability to support future disk drives with higher power dissipation. Unfortunately, it has been infeasible to effectively validate these storage systems without first acquiring and installing the new disk drives and then validating the cooling capability. This current approach for conducting the validation is daunting, expensive, and time consuming task.

DETAILED DESCRIPTION

An environment 10 with an example of a disk drive thermal performance testing device 16 is illustrated in FIGS. 1-3F. In this particular example, the environment 10 includes a storage system 12 with a plurality of slots or bays 14(0)-14(23) with a corresponding one of a plurality of storage disk drives or modules 15(0)-15(22) in slots 14(0)-14(22) and the disk drive thermal performance testing device 16 in slot 14(23), and a temperature sensing device 18 (shown in FIG. 1), although the environment can include other types and/or numbers of the same or different systems, devices, components and/or other elements in other configurations. Additionally, in this particular example for ease of illustration and description the disk drive thermal performance testing device 16 is only illustrated in slot 14(23) and could be located in any of the other slots 14(0)-14(22). Further, more than one disk drive thermal performance testing device 16 could be utilized for thermal testing, such as one disk drive thermal performance testing device 16 in each of the slots 14(0)-14(23) in storage system 12 by way of example only. This technology provides a number of advantages including providing disk drive thermal performance testing devices that are adjustable to fully characterize the thermal performance of different types of disk drives under different types of conditions.

Figure 1:
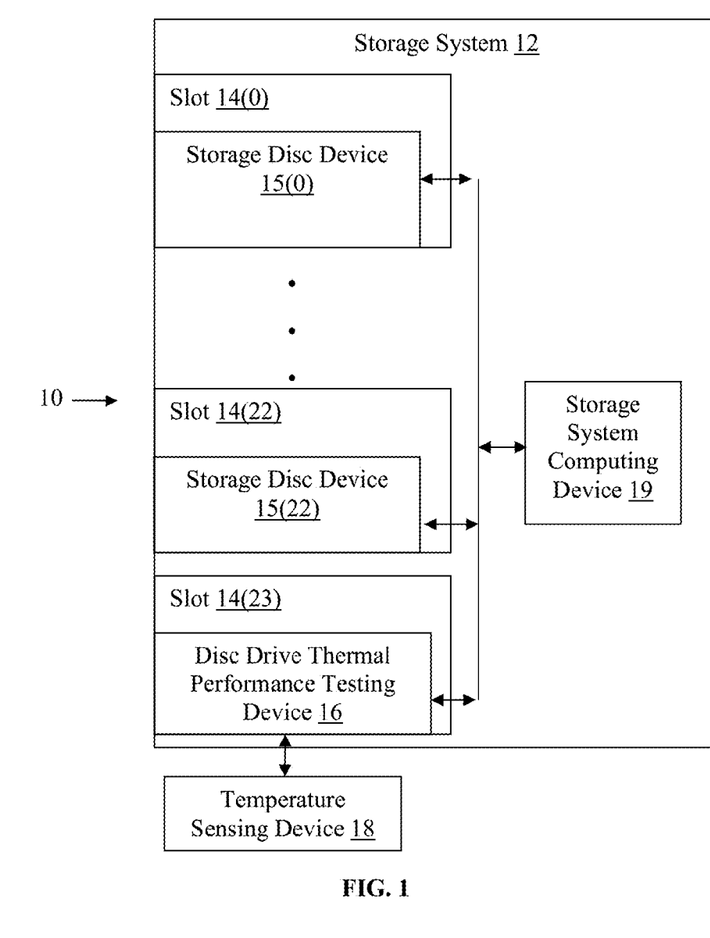
FIG. 1 is a block diagram of an environment with an example of a storage system with a plurality of storage disk drives and a disk drive thermal performance testing device.
Figure 2A:
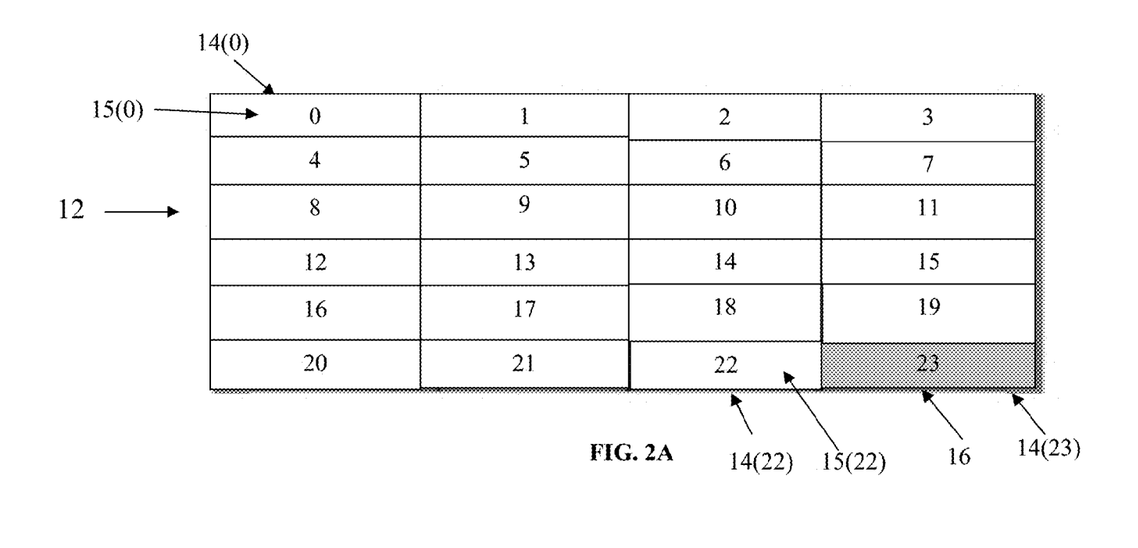
FIG. 2A is an end view of the example of the storage system with the plurality of storage disk drives and the disk drive thermal performance testing device shown in FIG. 2A.
Figure 2B:
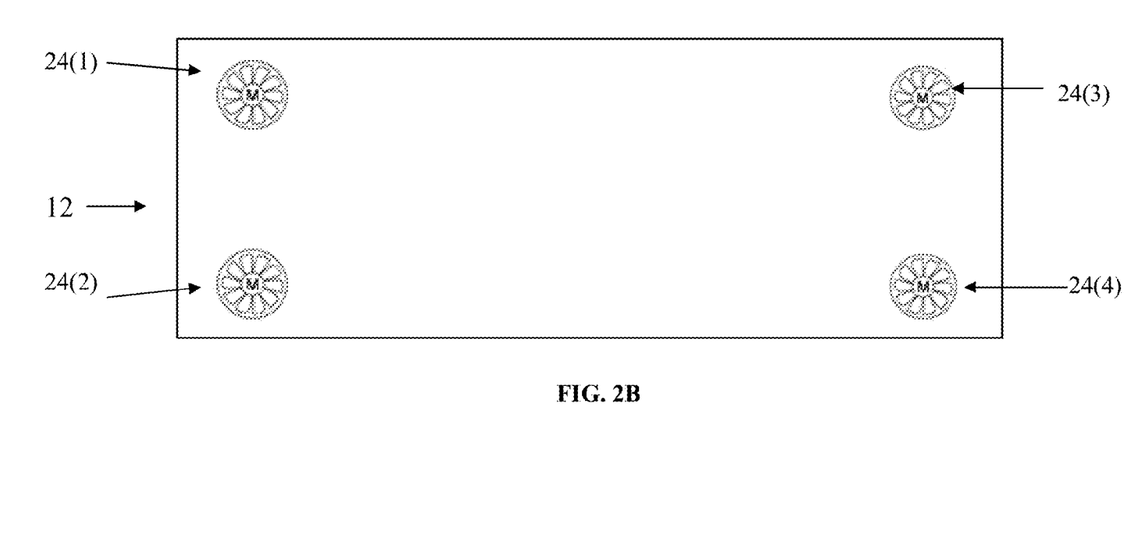
FIG. 2B is another end view of the example of the storage system with the plurality of storage disk drives and the disk drive thermal performance testing device shown in FIGS. 1 and 2A.
Figure 2C:
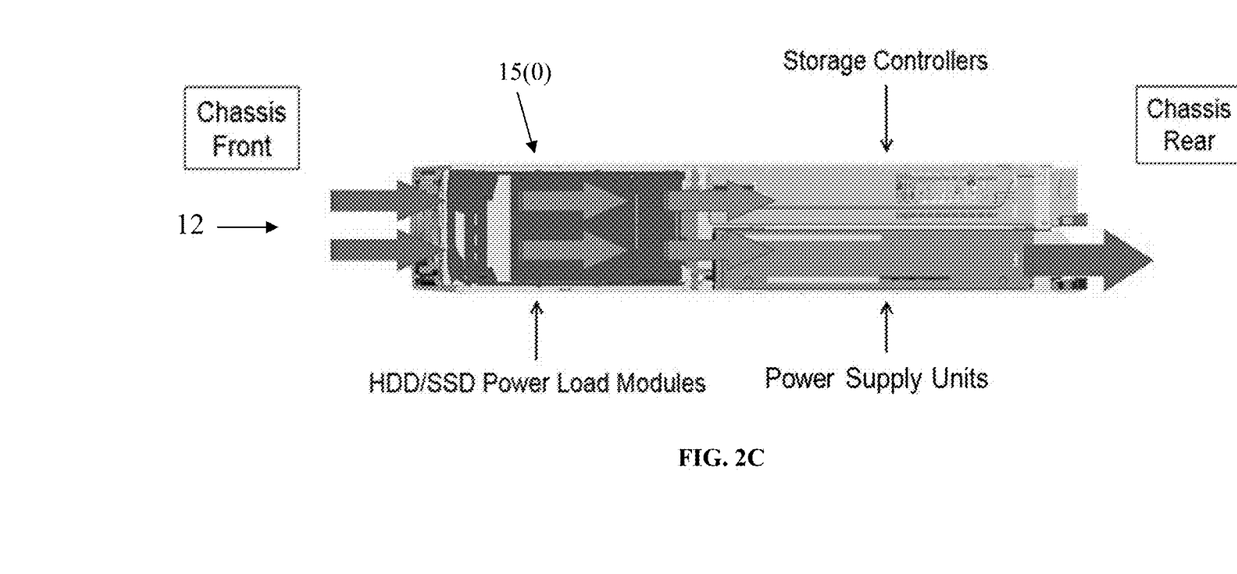
FIG. 2C is a cross-sectional view of a portion of the example of a storage system.

Referring more specifically to FIGS. 1-2C, in this particular example the storage system 12 is a storage shelf with storage slots or bays 14(0)-14(23) to detachably receive and couple with the storage disk drives 15(0)-15(22) in slots 14(0)-14(22) and in this example the disk drive thermal performance testing device 16 in slot 14(23) as well as a storage system computing device 19, cabling and/or other connection and/or other infrastructure for data storage. Additionally in this particular example, the storage system 12 is a storage shelf, although other types and/or numbers of storage systems which may receive and couple with one or more of storage disk drives may be used, such as a server or other computing device by way of example only.

The storage system computing device 19 may include a processor, a memory, a communication interface, and optionally an input device, and a display device, which are coupled together by a bus or other link, although the storage system computing device 19 can have other types and/or numbers of systems, devices, components and/or other elements in other configurations. In this particular example, the storage system computing device 19 is coupled to manage operations and/or other actions with any detachably coupled devices in one or more of the slots 14(0)-14(23) and optionally may be coupled to manage operations and/or actions with the temperature sensing device, although other types and/or numbers of systems, devices, components, and/or other elements may be used. By way of example only, the storage system computing device 19 may be coupled to a microcontroller 50 of the adjustable power loading device 30 to transmit control signals from the microcontroller 50 and/or the storage system computing device 19 coupled to the microcontroller 50 to turn on one or more of the transistors 46 coupled to one of the thermal load resistors 44, although other types of electrical and/or mechanical connections to turn switches on or off to one or more resistors could be used.

The storage system 12 may further comprise optional cooling devices 24(1)-24(4), such as fans by way of example only, which when activated may assist is providing air flow to cool in this example the storage disk drives 15(0)-15(22) and the disk drive thermal performance testing device 16, although the storage system may have other types and/or numbers of other systems, devices, components, and/or elements in other configurations.

In this particular example, the storage disk drives 15(0)-15(22) can be hard disk drives (HDD), solid state drives (SSD), or any other type of storage device suitable for storing files or objects in storage volumes for short or long term retention. In this particular example, the storage disk drives 15(0)-15(22) may have a standard 2.5 inch drive housing configuration or a 3.5 inch drive housing configurations which are sized to mate in a corresponding one of the slots or other bays 14(0)-14(23).

Referring to FIGS. 1, 2A, and 3A-3F, the disk drive thermal performance testing device 16 includes a drive housing 26, an electrical connector 28, and an adjustable power loading device 30, although the disk drive thermal performance testing device can have other types and/or numbers of systems, devices, components, and/or elements in other configurations. The drive housing 26 has a cover 32 and a base 38, although the drive housing can be constructed in other manners with other types and/or numbers of components and/or elements in other configurations. Additionally, the drive housing 26 may comprise a standard 2.5" drive housing configuration or a standard 3.5" drive housing configuration, although the drive housing may have other dimensions. Further, the surfaces of the drive housing 26, such as the cover 32 and base 38 by way of example only, may be made of one or more metal materials which act as a heat sink, although some or all of the drive housing could be made of other types and/or numbers of conductive and/or non-conductive materials.

Figure 3A:
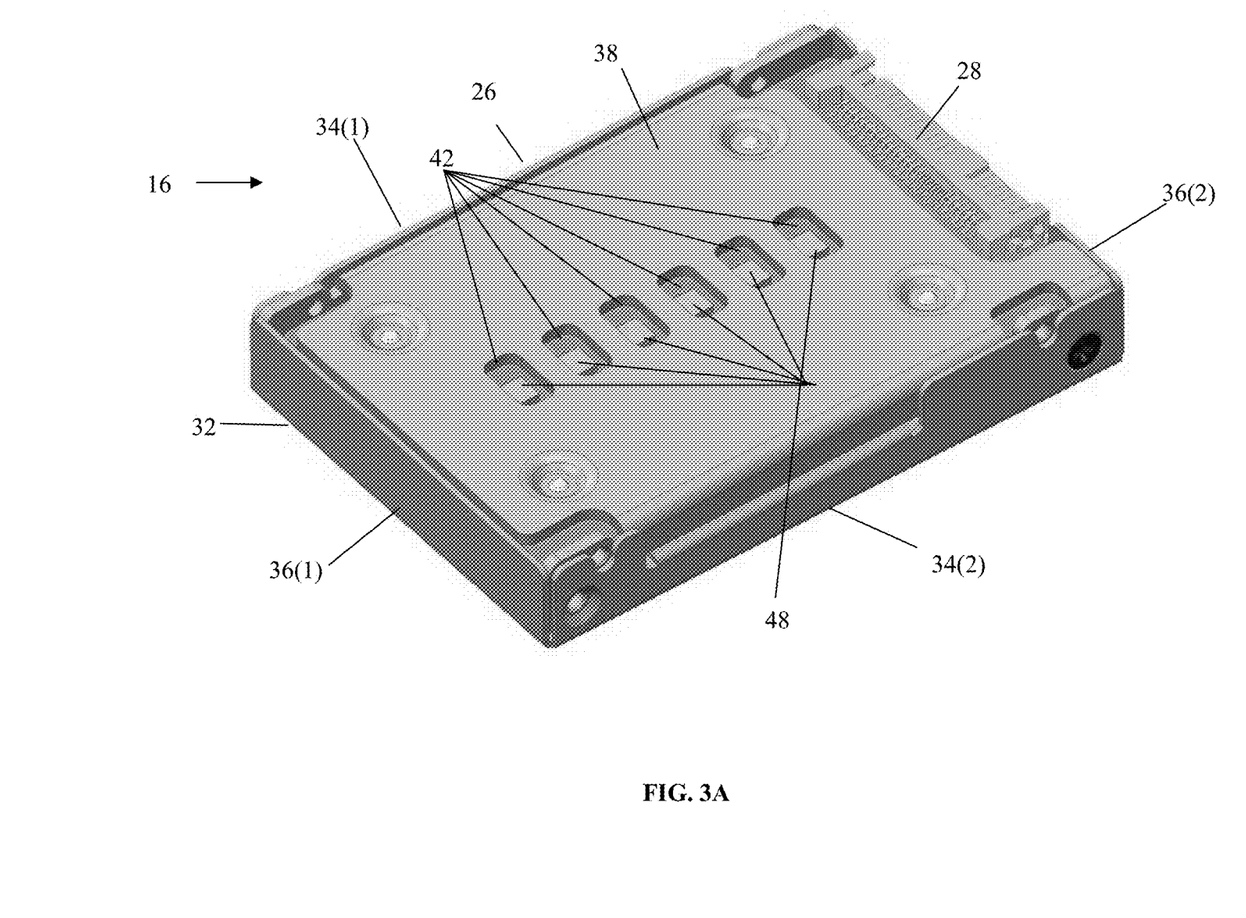
FIG. 3A is a perspective view of the example of the disk drive thermal performance testing device shown in FIGS. 1 and 2A.
Figure 3B:
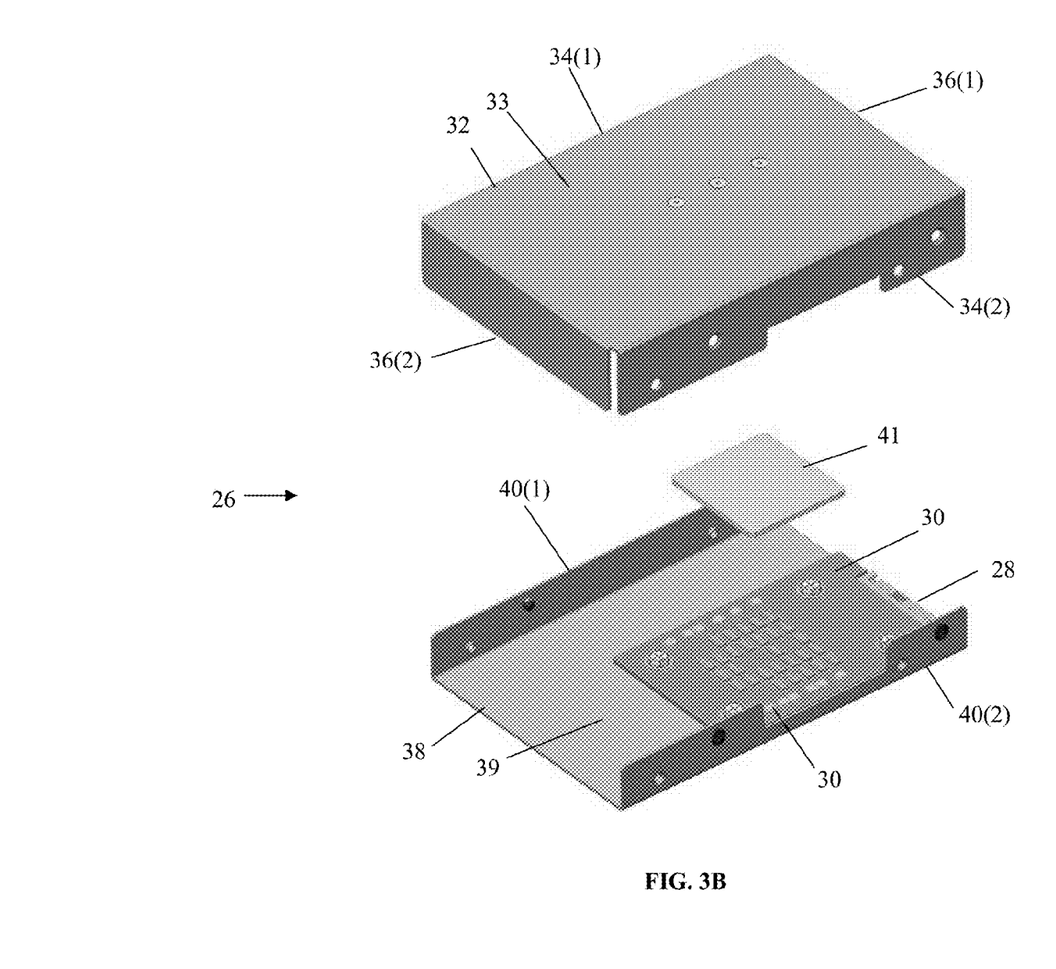
FIG. 3B is an exploded view of the example of the disk drive thermal performance testing device shown in FIG. 3A.
Figure 3C:
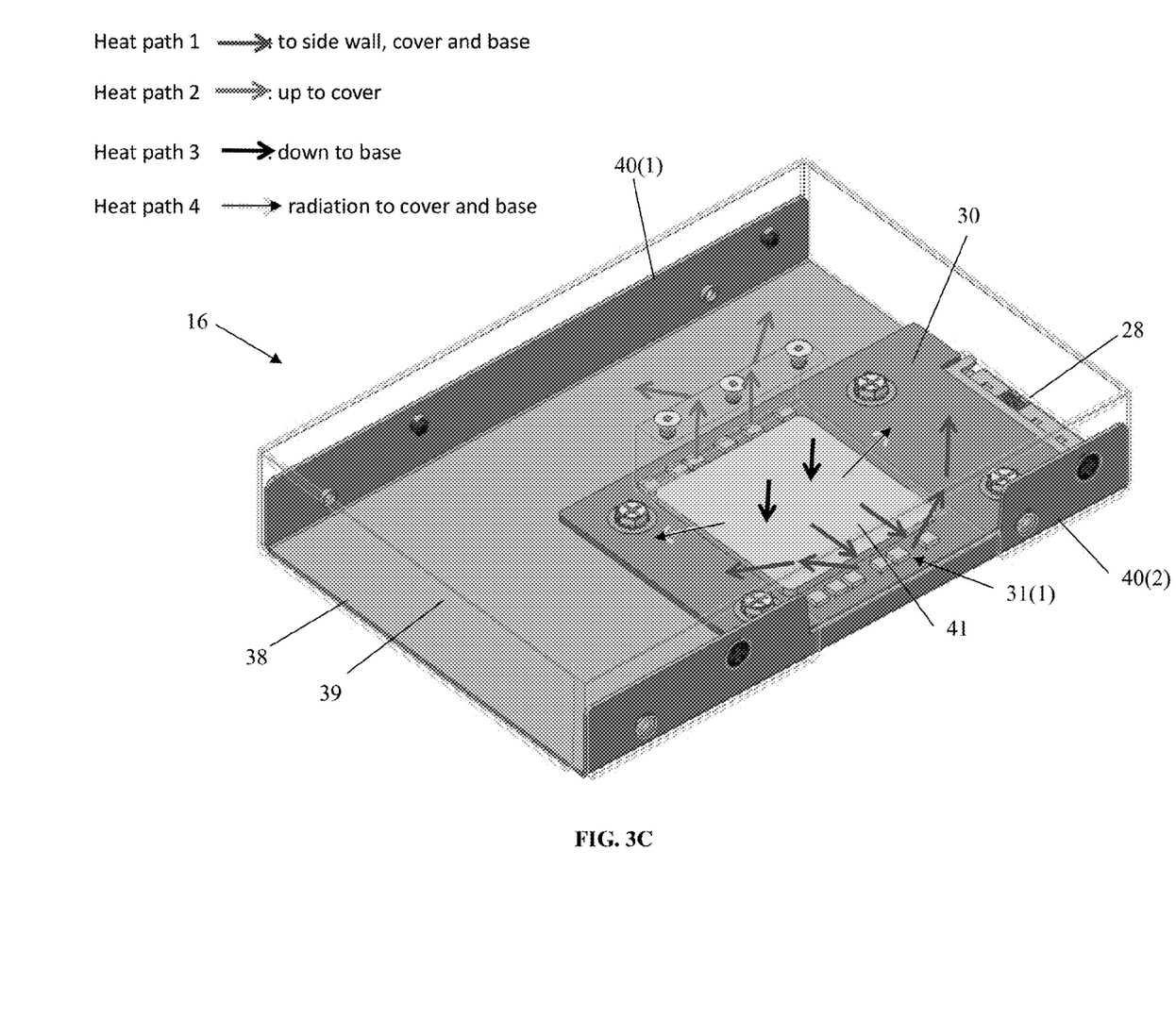
FIG. 3C is a perspective view of the example of a portion of the disk drive thermal performance testing device shown in FIG. 3A with the cover removed.
Figure 3D:
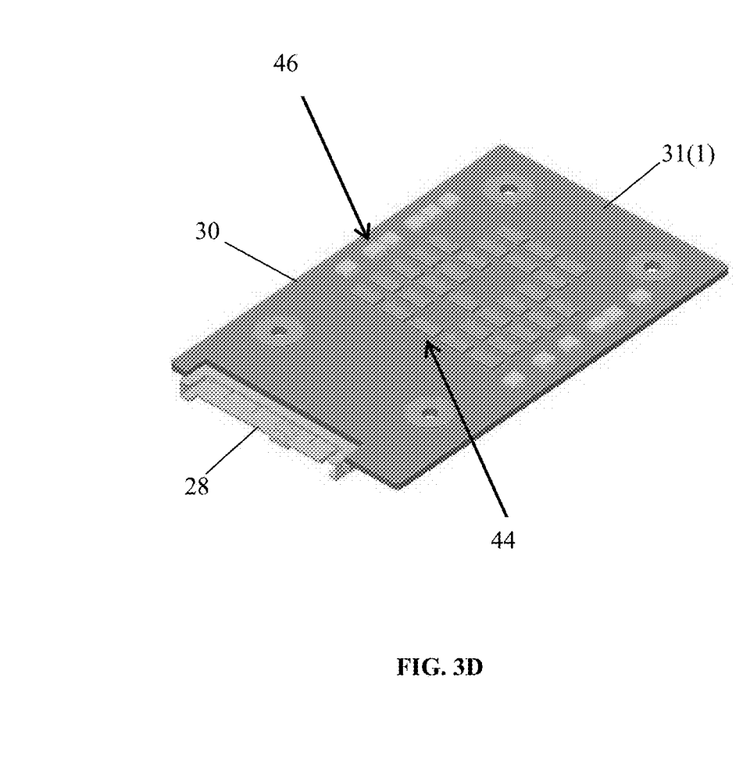
FIGS. 3D and 3E are top and bottom views of an example of an adjustable power loading circuit of the disk drive thermal performance testing device shown in FIG. 3A.
Figure 3E:
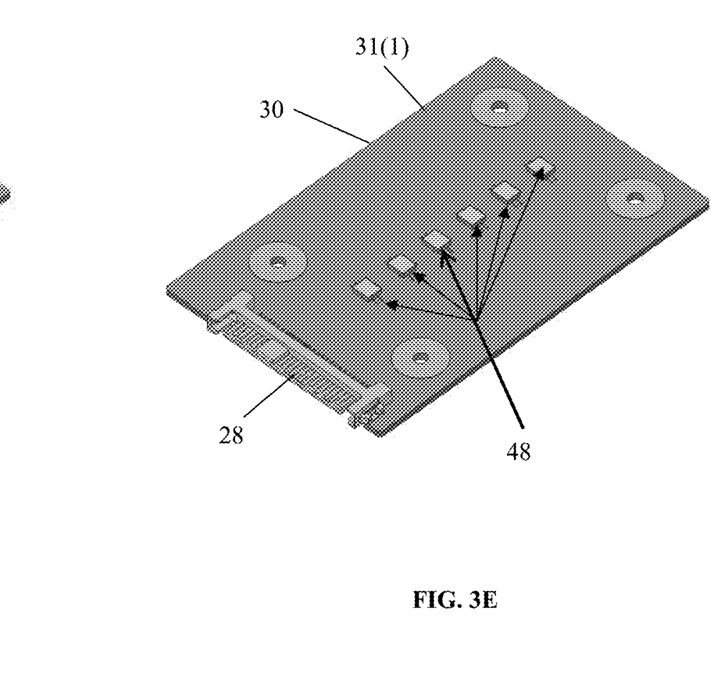
Figure 3F:
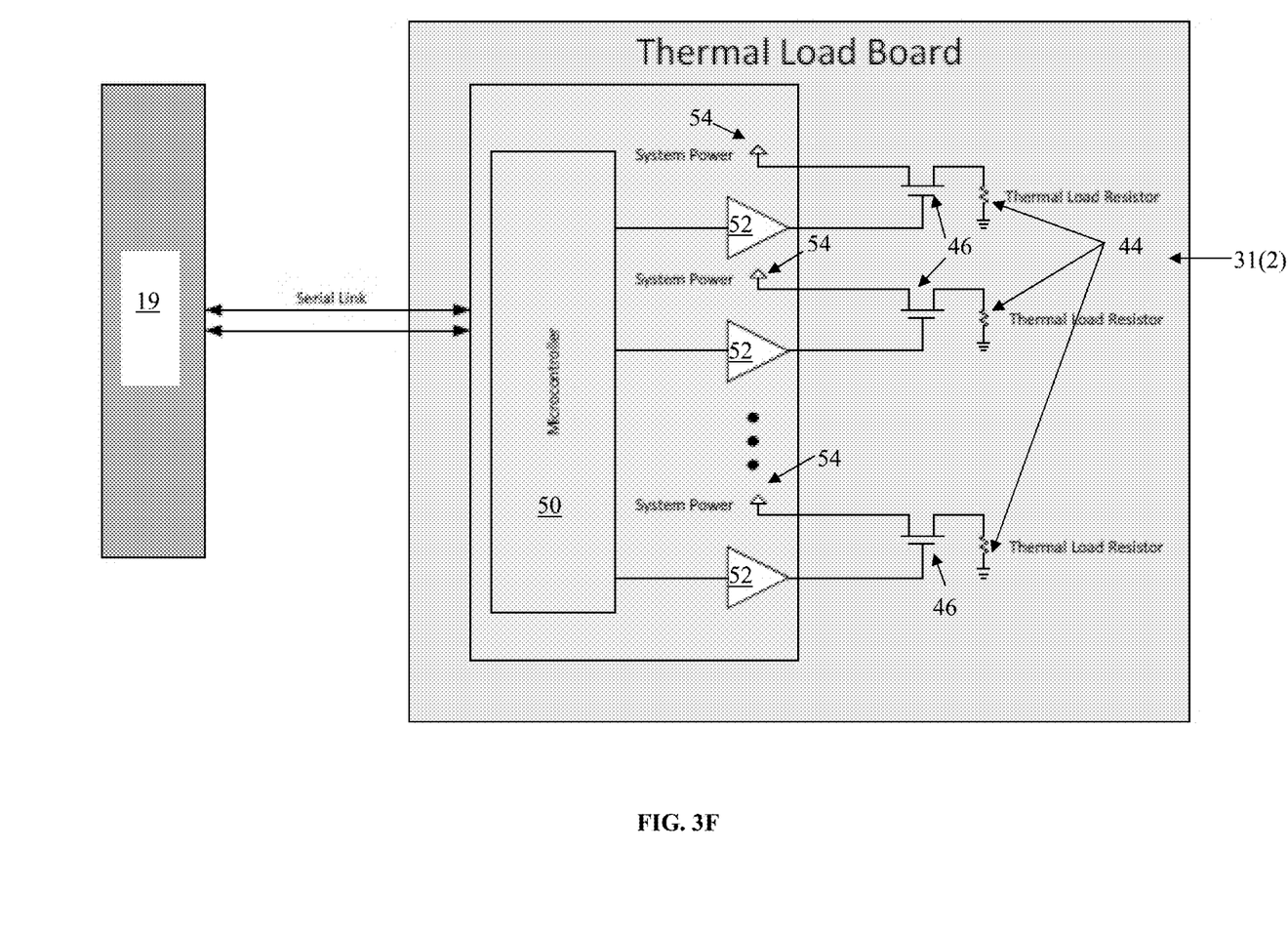
FIG. 3F is a partial block and partial circuit diagram of an example of an adjustable power loading circuit.

Referring to FIGS. 3A-3C, the cover 32 has rectangular shape with a cover surface 33 that extends to opposing sidewalls 34(1)-34(2) and opposing end walls 36(1)-36(2), although the cover could have other elements, shapes, and/or configurations. The base 38 has rectangular shape with a base surface 39 which extends to sidewalls 40(1)-40(2) and has a plurality of optional openings 42 to access switches in one example, although the base could have other elements, shapes, and/or configurations and other types of switches that do not require an opening in the base 38 may be used. The cover 32 and/or the base 38 may be made of one or more metal or other heat conductive materials, although the cover and/or base could be made of other types and/or numbers of materials. In this particular example, the base 38 is designed to detachably nest within the cover 32 and may be detachably secured together to form the drive housing 26, although the drive housing could be formed in other manners.

Referring to FIGS. 3B and 3C, a thermal interface material 41 is located over the thermal load resistors 44 and is thermally coupled to the drive housing 26 to allow heat to flow efficiently from the adjustable power loading device 30 out to the drive housing 26. The adjustable power loading device 30 may have other types and/or numbers of other systems, devices, components, and/or other elements, such as one or more other elements to assist with the thermal dissipation of heat by way of example only.

Referring to FIGS. 3A-3E, the adjustable power loading device 30 may be comprise an adjustable power loading circuit 31(1) with a plurality of thermal load resistors 44, transistors 46, and mechanical switches 48, although other types of adjustable power loading devices with other types and/or numbers of systems, devices, components and/or other elements may be used. For example, the adjustable power loading device 30 may comprise configurable logic which may be a plurality of configurable loads and a plurality of configurable switches with each of the configurable switches coupled between one of the plurality of configurable loads and a power source or the electrical connector 28. In this particular example, each of the switches 48 is a mechanical switch accessible through an opening 42 and is coupled between one of the thermal load resistors 44 and the electrical connector 28 which may be coupled to a power source, although these elements can be coupled in other manners and/or with other types and/or numbers of other systems, devices, components and/or other elements. In another example, the transistors 46 may be coupled between the electrical connector 28 or power source and the thermal load resistors 44 and may be operable between on and off positions based on received control signals. By opening or closing one or more of the mechanical switches 48 accessible via the openings 42, different power loads for characterizing thermal performance of the disk drive thermal performance testing device 16 can be quickly and easily selected and simulated. One or more of the switches 48 may comprise one of a slider switch or a jumper block.

Referring to FIG. 3F, in another example the adjustable power loading device 30 may comprise another adjustable power loading circuit 31(2). In this particular example, the adjustable power loading circuit 31(2) has a plurality of thermal load resistors 44, a plurality of transistors 46, a microcontroller 50, diodes 52, a power source 54 provided via a connection to the electrical connector 28, although the adjustable power loading circuit 31(2) could comprise other types and/or numbers of other systems, devices, components, and/or other elements in other configurations. In this particular example, each of the diodes 52 is coupled between the microcontroller 50 and a gate input to each of the transistors 46. A source of each of the transistors 46 is coupled to the power source 54 provided via a connection to the electrical connector 28. Each of the thermal load resistors 44 is coupled between a drain of one of the transistors 46 and ground. The microcontroller 50 may comprise configurable hardware logic configured to control the operation of the transistors 46 to turn on or off to supply power to one or more of the thermal load resistors 44 based on control signals received from the storage system computing device 19 via the serial link. The microcontroller 50 may comprise other systems, devices, components, and/or other elements and may contain programmed instructions to execute a simulation of a particular thermal load by providing power to one or more of the thermal load resistors 44.

Referring back to FIG. 1, one or more optional temperature sensing device 18 may be located external from and coupled to take measurements of the disk drive thermal performance testing device 16, although the optional temperature sensing device 18 may be in other locations, such as integrated within the disk drive thermal performance testing device 16 and/or other types and numbers of thermal performance monitoring devices may be used.

An example of a method for operating the disk drive thermal performance testing device 16 will now be described with reference to FIGS. 1-3F. First, the particular load of the disc drive thermal performance testing device 16 could be set by closing or opening one or more of the mechanical switches 48 accessible via the openings 42 shown in FIG. 3A to adjust the power load simulated by the corresponding one of the resistors 44 coupled to each of the switches, although other manners for adjusting the particular load being simulated may be used. By way of example only, if the adjustable power loading device 30 comprises the adjustable power loading circuit 31(2) then the disc drive thermal performance testing device 16 may first be installed in one of the slots 14(0)-14(23) in the storage system or other device and then during operation one or more of the transistors 46 could be turned on or off to provide power to one or more of the thermal load resistors 44.

Next, in this particular example the disk drive thermal performance testing device 16 may be placed in and detachably coupled in one of the slots or bays 14(0)-14(23) in the storage shelf 12, such as in slot or bay 14(23) in the example illustrated in FIG. 2A. As noted earlier, for ease of illustration and description only one disk drive thermal performance testing device 16 is illustrated in slot 14(23) and could be located in any of the other slots or bays 14(0)-14(22). Additionally, more than one disk drive thermal performance testing device 16 could be utilized for thermal performance testing, such as one disk drive thermal performance testing device 16 in each of the slots 14(0)-14(23) in storage system 12 by way of example only.

Next in the example shown in FIGS. 3A-3E, once the disk drive thermal performance testing device 16 is detachably loaded in the slot 14(23) and the electrical connector 28 is coupled to power, then the disk drive thermal performance testing device 16 may begin to simulate the heat generated based on the setting of the switches 48 in an on or off to position to control which thermal load resistors 44 or other thermal load device receives power. In the example shown in FIG. 3F, control signals from the storage system computing device 19 may be provided to the microcontroller 50 and/or the microcontroller 50 may execute programmed instructions to provide control signals to the gate of one or more of the transistors 46. The transistors 46 which are turned on based on this control signal couple power from the power source 54 which in this example is provided via electrical connector 28 to the corresponding one or more thermal load resistors 44 to simulate the desired thermal load.

When a thermal load is generated by one or more thermal load resistors 44 or other thermal load device, then the disk drive thermal performance testing device 16 is designed to simulate the standard heat conduction paths for a disk drive, such as for a standard 2.5" or 3.5" disk drive housing configuration. By way of example, these heat conduction paths can include: (1) a heat conduction path from the adjustable power loading device 30 to the sidewall 40(2) and then to the cover 32 and the base 38; (2) a heat conduction path from the adjustable power loading device 30 to the thermal interface material 41 into a bracket and then into the cover 32 and the base 38; (3) a heat conduction path from the adjustable power loading device 30 directly to the base 38; and (4) a heat conduction path from the adjustable power loading device 30 as radiation to the cover 32 and the base 38, although the simulated device may have other heat conductions paths.

Next, the temperature sensing device 18 may monitor, record and store thermal performance data of disk drive thermal performance testing device 16 in for example the storage system computing device 19 or other computing device based on the particular configuration set by the switches 48 or transistors 46 in the examples herein. This thermal performance data may by output to provide an indication of the performance of the simulated disk drive in the bay of the storage system.

Accordingly, as illustrated and described by way of the examples herein, this technology provides disk drive thermal performance testing devices that are adjustable to fully simulate the thermal performance of different types of disk drives under different types of conditions. The capability of this technology to simulate a variety of different types of disk drives substantially extends the ability to conduct validation testing. Additionally, this capability enables validation testing to be completed before incurring the more significant cost of acquiring one or more particular disk drives.

Having thus described the basic concept of the technology, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the technology. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:

1. A disk drive thermal performance testing device:
   a drive housing at least partially made of a thermally conductive material;
   an electrical connector in the drive housing which provides an external connection; and
   an adjustable power loading device adjustable by at least one mechanical switch and located in the drive housing, coupled to the electrical connector, and thermally coupled to the drive housing, wherein the adjustable power loading device further comprises an adjustable power loading circuit comprising:
   a plurality of thermal load resistors; and
   a plurality of switches, each of the switches is coupled between one of the plurality of thermal load resistors and the electrical connector, wherein one or more of the plurality of switches comprise at least one of a slider switch or a jumper block and wherein the drive housing has an opening to access the at least one of the slider switch or the jumper block.

2. The device as set forth in claim 1 wherein the drive housing further comprises one of a 2.5 inch drive housing configuration or a 3.5 inch drive housing configuration.

3. The device as set forth in claim 1 wherein one or more of the plurality of switches each comprise a transistor coupled between one of the thermal load resistors and a power source.

4. The device as set forth in claim 3 further comprising a controller coupled to control an on and off state of each of the transistors.

5. The device as set forth in claim 1 wherein the adjustable power loading device further comprises hardware logic comprising:
   a plurality of configurable loads; and
   a plurality of configurable switches, each of the configurable switches is coupled between one of the plurality of configurable loads and the electrical connector.

6. A method for making a disk drive thermal performance testing device, the method comprising:
   providing a drive housing at least partially made of a thermally conductive material;
   providing an electrical connector in the drive housing which provides an external connection; and
   locating an adjustable power loading device adjustable by at least one mechanical switch in the drive housing, coupled to an electrical connector and thermally coupled to the drive housing, wherein the locating the adjustable power loading device in the drive housing further comprises providing an adjustable power loading circuit in the drive housing, the adjustable power loading circuit comprising:
   a plurality of thermal load resistors; and
   a plurality of switches, each of the switches is coupled between one of the plurality of thermal load resistors and the electrical connector, wherein one or more of the plurality of switches comprise at least one of a slider switch or a jumper block and wherein the providing the drive housing further comprises providing an opening in the drive housing to access the at least one of the slider switch or the jumper block.

7. The method as set forth in claim 6 wherein the drive housing further comprises one of a 2.5 inch drive housing configuration or a 3.5 inch drive housing configuration.

8. The method as set forth in claim 6 wherein one or more of the plurality of switches each comprise a transistor coupled between one of the thermal load resistors and a power source.

9. The method as set forth in claim 8 further comprising coupling a controller to control an on and off state of each of the transistors.

10. The method as set forth in claim 6 wherein the locating the adjustable power loading device in the drive housing further comprises locating configurable hardware logic in the drive housing, the configurable hardware logic comprising:
   a plurality of configurable loads; and
   a plurality of configurable switches, each of the configurable switches is coupled between one of the plurality of configurable loads and the electrical connector.

* * * * *